(12) United States Patent
Kadoguchi et al.

(10) Patent No.: US 7,404,513 B2
(45) Date of Patent: Jul. 29, 2008

(54) WIRE BONDS HAVING PRESSURE-ABSORBING BALLS

(75) Inventors: Sohichi Kadoguchi, Oita (JP); Norihiro Kawakami, Beppu (JP)

(73) Assignee: Texas Instruments Incorporated, Dallas, TX (US)

( * ) Notice: Subject to any disclaimer, the term of this patent is extended or adjusted under 35 U.S.C. 154(b) by 77 days.

(21) Appl. No.: 11/026,840

(22) Filed: Dec. 30, 2004

(65) Prior Publication Data

US 2006/0144907 A1   Jul. 6, 2006

(51) Int. Cl.
*B23K 31/02*   (2006.01)
*B23K 1/06*   (2006.01)
(52) U.S. Cl. .................. 228/180.5; 228/110.1
(58) Field of Classification Search .............. None
See application file for complete search history.

(56) References Cited

U.S. PATENT DOCUMENTS

| | | | | |
|---|---|---|---|---|
| 4,695,870 A | * | 9/1987 | Patraw | 257/700 |
| 5,164,336 A | * | 11/1992 | Ohno et al. | 228/180.22 |
| 5,616,520 A | * | 4/1997 | Nishiuma et al. | 438/125 |
| 5,735,030 A | | 4/1998 | Orcutt | |
| 6,176,417 B1 | * | 1/2001 | Tsai et al. | 228/180.5 |
| 6,213,378 B1 | * | 4/2001 | Singh | 228/110.1 |
| 6,334,247 B1 | * | 1/2002 | Beaman et al. | 29/842 |
| 6,483,190 B1 | * | 11/2002 | Kainuma et al. | 257/737 |
| 6,523,255 B2 | * | 2/2003 | Shih et al. | 29/843 |
| 6,960,836 B2 | * | 11/2005 | Bachman et al. | 257/763 |
| 7,049,217 B2 | * | 5/2006 | Ishikawa et al. | 438/613 |
| 2002/0011674 A1 | * | 1/2002 | Efland et al. | 257/762 |
| 2002/0079354 A1 | * | 6/2002 | Lee | 228/180.5 |
| 2004/0080056 A1 | * | 4/2004 | Lim et al. | 257/784 |
| 2005/0124147 A1 | * | 6/2005 | Shiu et al. | 438/613 |

FOREIGN PATENT DOCUMENTS

| | | |
|---|---|---|
| EP | A20397426 | 11/1990 |
| JP | 55118643 A | 11/1980 |
| JP | 01293626 A | 11/1989 |
| JP | 0521192 A1 | 8/1993 |

* cited by examiner

*Primary Examiner*—Kiley Stoner
(74) *Attorney, Agent, or Firm*—Yingsheng Tung; Wade James Brady, III; Frederick J. Telecky, Jr.

(57) ABSTRACT

A semiconductor device with a chip having at least one metallic bond pad (101) over weak insulating material (102). In contact with this bond pad is a flattened metal ball (104) made of at least 99.999% pure metal such as gold, copper, or silver. The diameter (104*a*) of the flattened ball is less than or equal to the diameter (103*a*) of the bond pad. A wire (110) is connected to the bond pad so that the wire has a thickened portion (111) conductively attached to the flattened metal ball. The wire is preferably made of composed metal such as gold alloy. The composition of the flattened ball is softer than the wire. This softness of the flattened ball protects the underlying insulator against damage caused by pressure or stress, when the composed ball is attached.

13 Claims, 3 Drawing Sheets

WIRE BONDS HAVING
PRESSURE-ABSORBING BALLS

FIELD OF THE INVENTION

The present invention is related in general to the field of semiconductor devices and processes and more specifically to structure and method of metal bonds to contact pads over dielectrics.

DESCRIPTION OF THE RELATED ART

It is well known in semiconductor technology that bond pads on silicon integrated circuits can be damaged during conventional thermosonic wire bonding to circuit bond pad made of aluminum or copper. Mechanical loading and ultrasonic stresses applied by the tip of the bonding capillary to the bond pad are particularly suspect. When the damage is not apparent during the bonding process, the defects may manifest themselves subsequently by succumbing to thermo-mechanical stresses generated during plastic encapsulation, accelerated reliability testing, temperature cycling, and device operation. The damage appears in most cases as microcracks which may progress to fatal fractures in the underlying dielectric, as chip-outs of brittle or mechanically weak dielectric films, often together with pieces of metal or silicon, or as lifted ball bonds or delamination of metal layers.

Recent technological developments in the semiconductor industry tend to aggravate the problem. For instance, newer dielectric materials such as silicon-containing hydrogen silsesquioxane (HSQ) are being preferred due to their lower dielectric constant which helps to reduce the capacitance C in the RC time constant and thus allows higher circuit speed. Since the density and porosity of dielectric films affect the dielectric constant through absorption or desorption of water, films with these characteristics are introduced even when they are mechanically weaker. Films made of aerogels, organic polyimides, and parylenes fall into the same category. These materials are less dense and mechanically weaker than previous standard insulators such as the plasma-enhanced chemical vapor deposited dielectrics. This trend even affects stacks of dielectric layers such as alternating layers of plasma-generated tetraethylorthosilicate (TEOS) oxide and HSQ, or ozone TEOS oxide and HSQ. Since these materials are also used under the bond pad metal, they magnify the risk of device failure by cracking.

In addition, the pitch of bond pads is being progressively more reduced to save valuable silicon real estate. Consequently, the bonding parameters have to become more aggressive to achieve stronger bonds in spite of smaller size. Bonding force and ultrasonic energy during bonding are being increased. Again, the risk of yield loss and lowered reliability is enhanced.

Attempts to solve these problems by using softer wires and attachments balls have failed because these wires sag under their own weight in long-looping spans, or can be swept in the transfer molding process. In addition, these difficulties tend to get aggravated, when larger wire diameters are needed to keep the electrical resistance of long loops at an acceptable value. Furthermore, bonding balls made from these large-diameter wires would end up with ball diameters too large for the ever shrinking pad sizes.

SUMMARY OF THE INVENTION

A need has therefore arisen for a low cost, reliable wire bonding method combining simultaneously small ball sizes with reliable intermetallics, low risk of damaging the dielectrics under the bond pad during the bonding process, avoiding sagging of long wire spans, and keeping the electrical resistance of these long wire spans at acceptable values. There is a technical advantage, when the method is flexible enough to be applied for different semiconductor product families and a wide spectrum of design and assembly parameters, and also achieves improvements toward the goals of improved process yield and device reliability. These are further technical advantages when these innovations are accomplished using the installed equipment base so that no investment in new manufacturing machines is needed.

One embodiment of the invention is a semiconductor device with a chip, which has at least one metallic bond pad over insulating material. In contact with this bond pad is a flattened metal ball made of at least 99.999% pure metal such as gold, copper, or silver. The diameter of the flattened ball is less than or equal to the diameter of the bond pad. A wire is connected to the bond pad so that the wire has a thickened portion conductively attached to the flattened metal ball. The wire is preferably made of composed metal such as gold alloy, copper alloy, or copper-coated gold; the composition of the flattened ball is softer than the wire. This softness of the flattened ball protects the underlying insulator against damage caused by pressure or stress, when the composed ball is attached, even when the insulator includes mechanically weak dielectrics.

The device may also have an electrically conducting line spaced from the bond pad by a gap. The wire is spanning this gap by means of a loop of controlled shape, whereby the bond pad is connected to the conducting line. Due to the hardness of the composed wire, the loop does not sag even for long spans. Furthermore, the wire has a diameter selected so that the electrical resistance of the loop can be kept below a pre-determined value.

Another embodiment of the invention is a method for fabricating a semiconductor device, which has a chip with at least one bond pad over insulator material. A flattened metal ball is formed in contact with the bond pad. A wire is then connected to the bond pad by forming a thickened portion of the wire and conductively attaching the thickened portion to the flattened metal ball, which has a composition softer than the wire.

Another embodiment of the invention is a method for fabricating a semiconductor device, which starts by providing a semiconductor chip with at least one metallic bond pad over insulator material. A first free air ball is formed at the tip of a first capillary, which is loaded with a wire of at least 99.999% pure metal. The freshly formed first free air ball is then attached to the bond pad, flattened by means of the first capillary, and separated from the pure wire. A second free air ball is formed at the tip of a second capillary, which is loaded with a wire of composed metal. The freshly firmed second free air ball is then attached to the flattened first ball and flattened by means of the second capillary; the composed wire is finally spanned into a controlled loop. The diameter of the composed wire is selected so that the loop has a predetermined electrical resistance.

It is a technical advantage of the invention to eliminate restrictions on the size of the dielectric pattern, thus minimizing the risks of inflicting cracking damage even to very brittle dielectrics.

It is another technical advantage of the invention to provide design concepts and process methods which are flexible so that they can be applied to several families of products, and are general, so that they can be applied to several generations of products. The invention supports the ongoing miniaturization trend in the semiconductor industry, especially the shrinking of bond pad diameters.

Another object of the invention is to use only processes already employed in the fabrication of integrated circuit devices, thus avoiding the cost of new capital investment and using the installed fabrication equipment base.

The technical advances represented by certain embodiments of the invention will become apparent from the following description of the preferred embodiments of the invention, when considered in conjunction with the accompanying drawings and the novel features set forth in the appended claims.

DETAILED DESCRIPTION OF THE PREFERRED EMBODIMENTS

Figure 1:
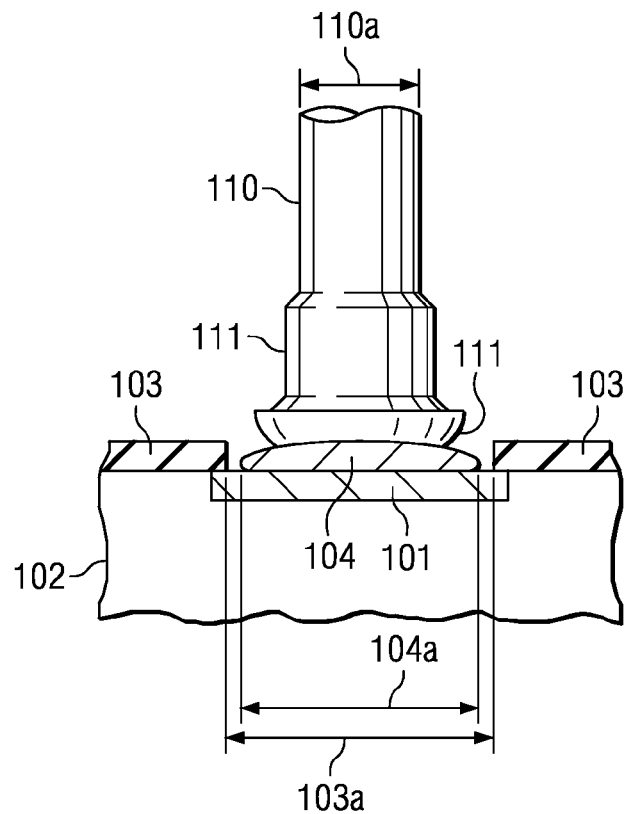
FIG. 1 is a schematic cross section of a contact pad on a semiconductor device with metals attached according to an embodiment of the invention.

The schematic cross section of FIG. 1 illustrates a portion on the surface of a semiconductor device, which has a protective overcoat 103, typically consisting of silicon nitride or oxynitride. A window in this overcoat exposes a metallic bond pad 101. The window has a diameter 103a. Bond pad 101 is located over insulating material 102. The bond pad metal 101 may be aluminum or copper, or stacked layers thereof. The insulator 102 may include mechanically weak dielectrics such as silicon-containing hydrogen silsesquioxane (HSQ), aerogels, organic polyimides, parlenes, or alternating layers of plasma-generated tetraethylorthosilicate (TEOS) oxide and HQS, or ozone TEOS oxide and HSQ. The mechanical weakness of these dielectrics, generally referred to as low-k dielectrics, is prone to suffer cracks by mechanical pressure and stress created during the wire bonding operations, but their lower dielectric constant helps to reduce the capacitance C in the RC time constant of circuits and thus allows higher circuit speed.

A flattened metal ball 104 is in contact with bond pad 101. In this embodiment, the diameter 104a of ball 104 is less than or equal to diameter 103a of the overcoat window and the flattened metal ball is made of metal at least 99.999% pure, such as pure gold, copper, or silver. These metals are commercially available by many companies, for instance, Nittetu Micro Metal, Japan, under the brand name 5N, or Degussa, Germany. At these high purity levels, these metals are very soft, especially when they are macro-crystalline (heat treated).

FIG. 1 further shows a wire 110 connected to the bond pad, wherein the wire has a diameter 110a and a thickened portion 111. Preferably, thickened portion 111 is created from a free air ball at the end of wire 110, by flattening this air ball. The thickened portion 111 is conductively attached to the flattened metal ball 104. Wire 110 is a composed metal such as gold alloy, copper alloy, or copper-coated gold, and has typically a diameter of about 20 to 25 µm. These wires are commercially available by many companies, for instance, Nittetu Micro Metal, Japan, under the brand name NT. In this composition, metal 110 is harder than the soft metal 104. These wires will, therefore, not sag even at long wire loops, and by choosing a large enough diameter, they will also have an electrical resistance lower than a predetermined value.

Figure 2:
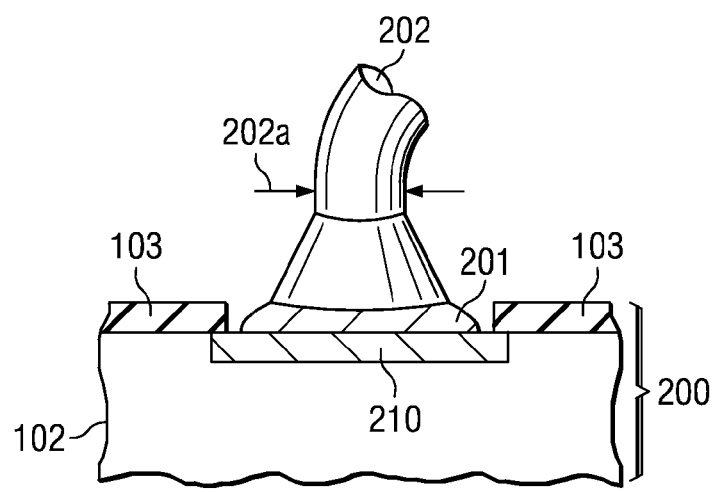
FIG. 2 is a schematic cross section of a contact pad on a semiconductor device after the first step of a contact fabrication method according to an embodiment of the invention.

The cross section of FIG. 2 illustrates schematically a preferred method of fabricating a flattened ball 201 from a wire 202 of diameter 202a by employing the generally practiced wire ball bonding technology. Diameter 202a of wire 202 is preferably smaller than diameter 110a of bonding wire 110.

The preferred wire bonding process begins by positioning the semiconductor chip (only portion 200 shown in FIG. 2) on a heated pedestal to raise the temperature to between 150 and 300° C. The gold wire 202 is strung through a capillary of a diameter suitable for wired diameter 202a and a predetermined orifice. At the tip of the wire, a free air ball is created using either a flame or a spark technique. The ball has a typical diameter from about 1.2 to 1.6 wire diameters. The capillary is moved towards the chip bonding pad 210 and the ball is pressed against the metallization of the pad. Generally, a combination of compression force and ultrasonic energy create the formation of intermetallics between ball metal and pad metal and thus a strong metallurgical bond. The compression (also called Z- or mash) force is typically between about 17 and 75 g; the ultrasonic time between about 10 and 20 ms; the ultrasonic power between about 20 and 50 mW. At time of bonding, the temperature usually ranges from 150 to 270° C. For gold wire on copper pad, metal interdiffusion takes place in order to generate the strong weld. The exact outline of the flattened ball on FIG. 2 is a function of the shape of the capillary orifice; the ball will be more flattened by the impact of the thickened wire end (ball) (111 in FIG. 1).

With the soft flattened ball 201 protecting the bond pad and its underlying dielectrics, the air ball 111 (FIG. 1) formed from wire 110 can be metallurgically attached with the required ultrasonic energy and pressure. In this action, ball 201 is flattened approximately into the shape shown for ball 104 in FIG. 1. After flattened ball 111 is attached, automated wire bonding allows tightly controlled shape of the wire loop.

Figure 3:
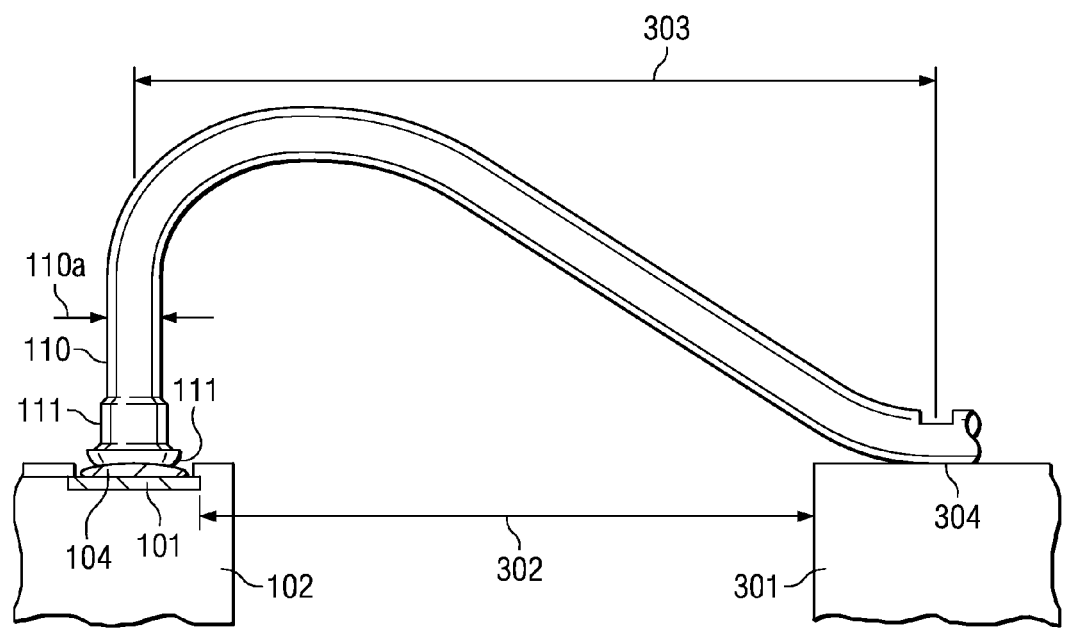
FIG. 3 is a schematic cross section of a completed bonding wire loop having a contact to a semiconductor bond pad fabricated according to the invention.

As schematically illustrated in the example of FIG. 3, an electrically conducting line 301, or leadframe segment, is spaced from bond pad 101 by a gap 302. The gap 302 is bridged by wire loop 303. Moving the capillary in a predetermined and computer-controlled manner through the air will create a wire looping of exactly defined shape. For instance, with a modern wire bonder, rounded, trapezoidal, linear and customized loop paths can be formed without sagging. The electrical resistance of the whole loop 303 is kept under a predetermined value by the suitably large selected diameter 110a of wire 110. Finally, the capillary reaches its desired destination at conductive line or leadframe segment 301. The capillary is lowered to touch the line at 304; with the imprint of the capillary, a metallurgical stitch bond is formed, and the wire is broken off to release the capillary. Stitch contacts are small yet reliable; the lateral dimension of the stitch imprint is about 1.5 to 3 times the wire diameter (its exact shape depends on the shape of the capillary used, such as capillary wall thickness and capillary footprint).

Figure 4:
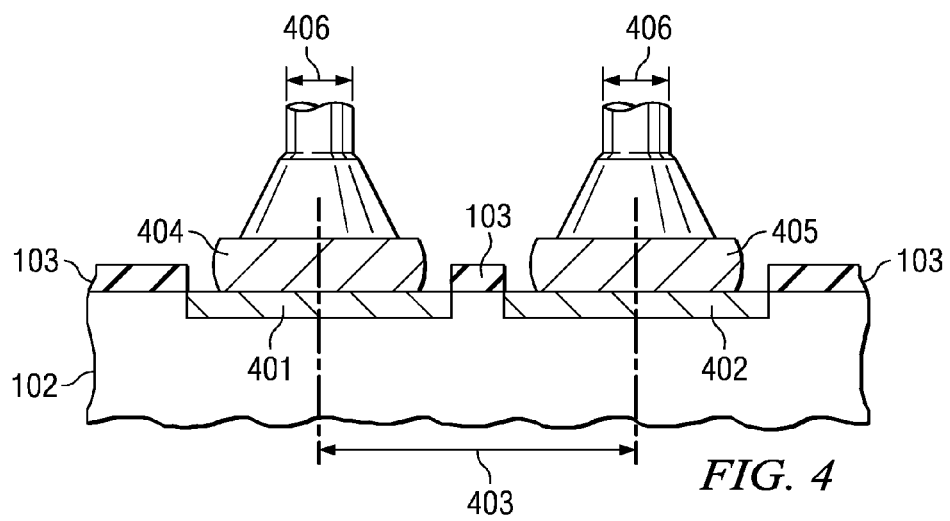
FIG. 4 is a schematic cross section of two adjacent contact pads after the first step of a contact fabrication method according to an embodiment of the invention.

FIG. 4 shows two bond pads 401 and 402 in close proximity; the ongoing trend in semiconductor technology is that the pad pitch 403 center-to-center is shrinking. It is a technical advantage of the present invention that it supports this trend towards fine pad pitch, because it provides metal stud contacts in the form of soft flattened balls 404 and 405, which may have a diameter smaller than or equal to the diameter of pads 401 and 402. The flattened balls 404 and 405 have been made from soft metal wire of small enough diameter 406.

Figure 5:
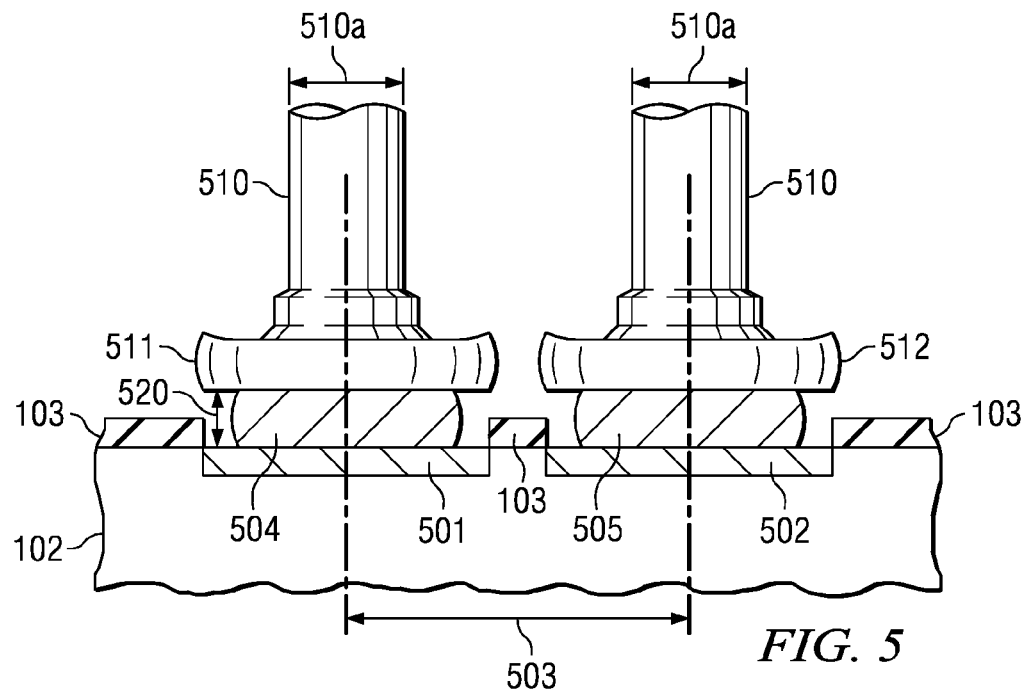
FIG. 5 is a schematic cross section of two adjacent contact pads after completing the contact fabrication according to an embodiment of the invention.
Figure 6:
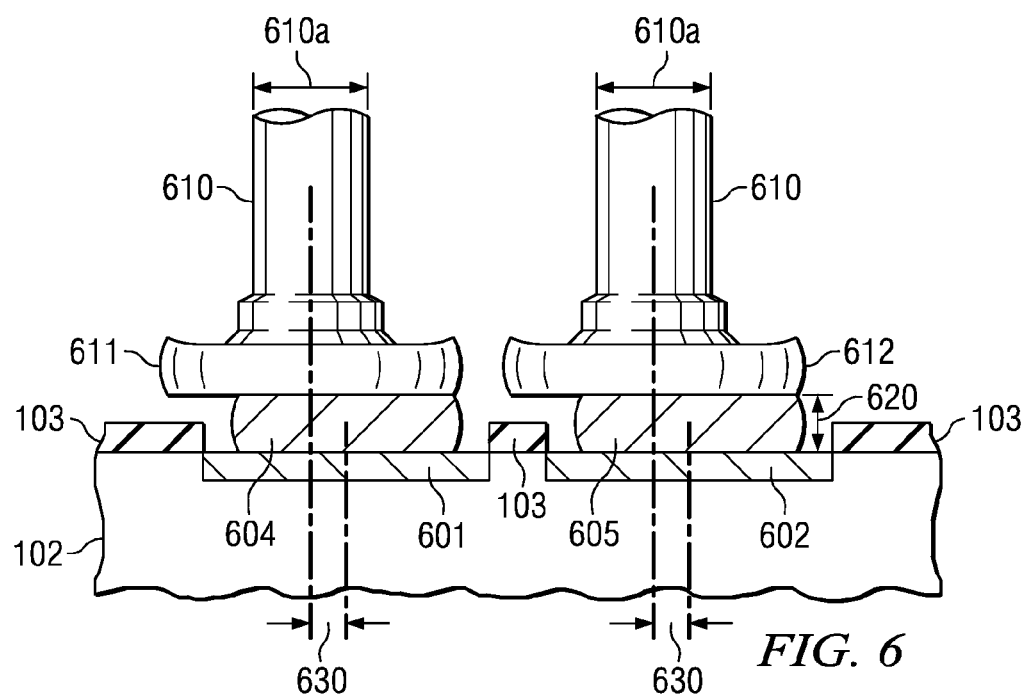
FIG. 6 is a schematic cross section of two adjacent contact pads illustrating the improved process tolerance gained by the contact fabrication method of the invention.

FIGS. 5 and 6 illustrate how the present invention supports flattened contact balls with a diameter as large as, or even slightly larger than, the bond pads. In FIG. 5, two bond pads are designated 501 and 502, respectively, having a pitch center-to-center 503. The flattened, soft contact balls of small diameter, made from highly pure wire of small diameter, are designated 504 and 505, respectively. The wire 510 of harder metal and larger diameter 510a provides flattened balls 511 and 512 having a diameter as large as, or even slightly larger than, the diameter of pads 501 and 502. The large diameter of balls 511 and 512 can be tolerated because of the height 520 of the underlying flattened sift balls 504 and 505. FIG. 5 illustrates a flattened ball 511 and 512 in good alignment with contact pads 501 and 502, indicated by the dashed center lines.

In FIG. 6, however, the automated bonder of the capillary with the hard wire was misaligned relative to the pad locations, and thus produced flattened contact balls 611 and 612 having center lines systematically misaligned relative to the center lines of the pads. The misalignment is designated 630. In spite of this mishappening, no electrical short between neighboring pads 601 and 602 is produced due to the height 620 of the flattened soft balls 604 and 605 under the balls 611 and 612. The invention thus supports process forgiveness in the device fabrication.

Another embodiment of the invention is the preferred method for fabricating a semiconductor device, which comprises the following steps: Providing a semiconductor chip having at least one metallic bond pad over insulator material; the insulator may include mechanically weak low-k dielectrics. Next, forming a first free air ball at the tip of a first capillary loaded with an at least 99.999% pure metal wire; examples include gold, copper, and silver wire. Next, attaching the freshly formed first free air ball to the bond pad, flattening the first ball by means of the first capillary, and separating the flattened first ball from the pure wire.

The step of attaching the first free air ball may include mechanical pressure and ultrasonic energy without damaging mechanically weak low-k dielectrics under the bond pad, because of the softness of the pure metal. The step of separating the flattened ball may consist of a flame-off process. It is preferred that the flattened first ball has a diameter smaller than or equal to the diameter of the bond pad.

In the next process step, a second free air ball is formed at the tip of a second capillary loaded with a composed metal wire. Examples of composed metals are alloys, such as gold alloy, coated wires, such as copper-coated gold, and process-hardened wires. The freshly formed second free air ball is then attached to the flattened first ball; in this process, the second ball is flattened by means of said second capillary. The diameter of the second flattened ball may be approximately the diameter of the bond pad. The step of attaching the second free air ball may include mechanical pressure and ultrasonic energy, but they are less likely to damage mechanically weak low-k dielectrics under the bond pad, because the flattened first ball made out of soft metal acts as a pressure-absorbing cushion.

Subsequently, the composed wire is spanned into a controlled loop, which bridges a gap between the bond pad an electrically conductive line or a leadframe segment. The diameter of the composed wire is selected so that the loop has an electrical resistance equal to or below a certain predetermined value. This means, the diameter of the composed-metal wire may be larger than the diameter of the pure-metal wire.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description.

As an example, the invention covers integrated circuits made in silicon, silicon germanium, gallium arsenide, or any other semiconductor material used in integrated circuit manufacture.

As another example, in some devices, the dielectrics are fortified by metal-grid structures. For these strengthened insulators, a first flattened ball made of lightly less pure metal, for example, 99.99% or 99.9%, may be satisfactory.

It is therefore intended that the appended claims encompass any such modifications or embodiments.

We claim:

1. A method for fabricating a semiconductor device, comprising the steps of:
   providing a semiconductor chip having at least one metallic bond pad over insulator material;
   forming a first free air ball of a first metal wire having a first composition at the tip of a first capillary;
   attaching said first free air ball to said bond pad, and separating said first ball from said first metal wire;
   providing a second metal wire having a second composition harder than the first composition;
   forming a second free air ball of the second metal wire at the tip of a capillary; and
   attaching said second free air ball to said first ball.

2. The method according to claim 1 further comprising the step of spanning said composed wire into a controlled loop to an electrically conducting line spaced from said bond pad by a gap and attaching the end of said loop to said line so that said loop bridges said gap.

3. The method according to claim 1 wherein said process steps of attaching said air balls include mechanical pressure and ultrasonic energy supplied by said capillaries.

4. The method according to claim 1 wherein said second wire is selected from a group of wires consisting of alloys, coated wires, and process-hardened wires.

5. The method according to claim 1 wherein said bond pad has an area and said first free air ball has a bottom area smaller than or equal to said bond pad area.

6. The method according to claim 1 wherein said step of separating said first ball from said pure wire is performed by flaming off said wire.

7. The method according to claim 2 wherein the diameter of said second wire is selected so that said controlled loop has a predetermined electrical resistance.

8. The method according to claim 7 wherein said diameter of said second wire is larger than the diameter of said first wire.

9. A method for fabricating a semiconductor device, comprising the steps of:
   providing a semiconductor chip having at least one metallic bond pad over an insulator material;

forming a metal ball in contact with said bond pad from a first metal wire with a first composition; and connecting a second wire having a second composition harder than the first composition to said bond pad by forming a thickened portion of said wire on said metal ball.

10. The method of claim 9, in which the ball is a gold ball of at least 99% purity.

11. The method of claim 9, in which the ball is a gold ball of at least 99.999% purity.

12. The method of claim 1, in which the first wire is a gold wire of at least 99% purity.

13. The method of claim 1, in which the first wire is a gold wire of at least 99.999% purity.

* * * * *